United States Patent
Gu (10) Patent No.: US 8,957,494 B2
(45) Date of Patent: Feb. 17, 2015

(54) HIGH-VOLTAGE SCHOTTKY DIODE AND MANUFACTURING METHOD THEREOF

(71) Applicant: CSMC Technologies FAB1 Co., Ltd., Jiangsu (CN)

(72) Inventor: Lihui Gu, Jiangsu (CN)

(73) Assignee: CSMC Technologies FAB1 Co., Ltd., Jiangsu (CN)

( * ) Notice: Subject to any disclaimer, the term of this patent is extended or adjusted under 35 U.S.C. 154(b) by 0 days.

(21) Appl. No.: 14/130,449

(22) PCT Filed: Oct. 23, 2012

(86) PCT No.: PCT/CN2012/083344
§ 371 (c)(1),
(2) Date: Dec. 31, 2013

(87) PCT Pub. No.: WO2013/064024
PCT Pub. Date: May 10, 2013

(65) Prior Publication Data
US 2014/0145290 A1    May 29, 2014

(30) Foreign Application Priority Data
Oct. 31, 2011    (CN) .......................... 2011 1 0339641

(51) Int. Cl.
*H01L 29/872*    (2006.01)
*H01L 29/06*    (2006.01)
*H01L 29/66*    (2006.01)
*H01L 29/40*    (2006.01)
*H01L 29/10*    (2006.01)

(52) U.S. Cl.
CPC ...... *H01L 29/0634* (2013.01); *H01L 29/66143* (2013.01); *H01L 29/872* (2013.01); *H01L 29/402* (2013.01); *H01L 29/0619* (2013.01); *H01L 29/10* (2013.01)

USPC .......................................... 257/483; 438/570

(58) Field of Classification Search
USPC .......... 257/471, 476, 480, 483, 484; 438/167, 438/176, 534, 570, 571
See application file for complete search history.

(56) References Cited

U.S. PATENT DOCUMENTS

| 5,614,755 | A | 3/1997 | Hutter et al. | |
| 7,064,407 | B1* | 6/2006 | Mallikarjunaswamy | ..... 257/471 |
| 2008/0135970 | A1 | 6/2008 | Kim et al. | |
| 2009/0065888 | A1* | 3/2009 | Kato et al. | ..... 257/476 |
| 2010/0233862 | A1* | 9/2010 | Cai | ..... 438/237 |

FOREIGN PATENT DOCUMENTS

| CN | 101882885 A | 11/2010 |
| TW | 201025620 A | 7/2010 |

* cited by examiner

*Primary Examiner* — Michele Fan
(74) *Attorney, Agent, or Firm* — Muncy, Geissler, Olds & Lowe, P.C.

(57) ABSTRACT

A high-voltage Schottky diode and a manufacturing method thereof are disclosed in the present disclosure. The diode includes: a P-type substrate and two N-type buried layers, a first N-type buried layer is located below a cathode lead-out area, and a second N-type buried layer is located below a cathode region; an epitaxial layer; two N-type well regions located on the epitaxial layer, a first N-type well region is a lateral drift region and it is provided with a cathode lead-out region, and a second N-type well region is located on the second N-type buried layer and it is a cathode region; a first P-type well region located on the second N-type buried layer and surrounding the cathode region; a field oxide isolation region located on the lateral drift region; an anode located on the cathode region and a cathode located on the surface of the cathode lead-out region.

14 Claims, 9 Drawing Sheets

HIGH-VOLTAGE SCHOTTKY DIODE AND MANUFACTURING METHOD THEREOF

FIELD OF THE INVENTION

The present disclosure relates to a field of semiconductor manufacturing technology, and more particularly relates to a high-voltage Schottky diode and a manufacturing method thereof.

BACKGROUND OF THE INVENTION

In high voltage integrated circuit (referred hereafter as HVIC), a bootstrap diode is often used. Taking a half-bridge drive circuit as an example, referring to FIG. 1, the working process of the half-bridge is that: when a floating power supply terminal VS is applied with a low level voltage, a terminal VCC charges a bootstrap capacitor 2 through a bootstrap diode 1, and supplies power to a power supply terminal VB on a high voltage side. When the terminal VS is applied with high voltage, the voltage of the terminal VS exceeds the voltage of the terminal VCC with the help of the bootstrap capacitor 2, the bootstrap diode is in a reverse blocking state, the terminal VS supplies power to a circuit on the high voltage side through the bootstrap capacitor 2. In the above process, the bootstrap diode needs to withstand high voltage, the bootstrap diode needs to have characteristics of small leakage and fast recovery, the common Schottky diode has a characteristic of fast switching, which means it can recover quickly, but it cannot withstand high voltage, and it cannot be used as a bootstrap diode.

Figure 1:
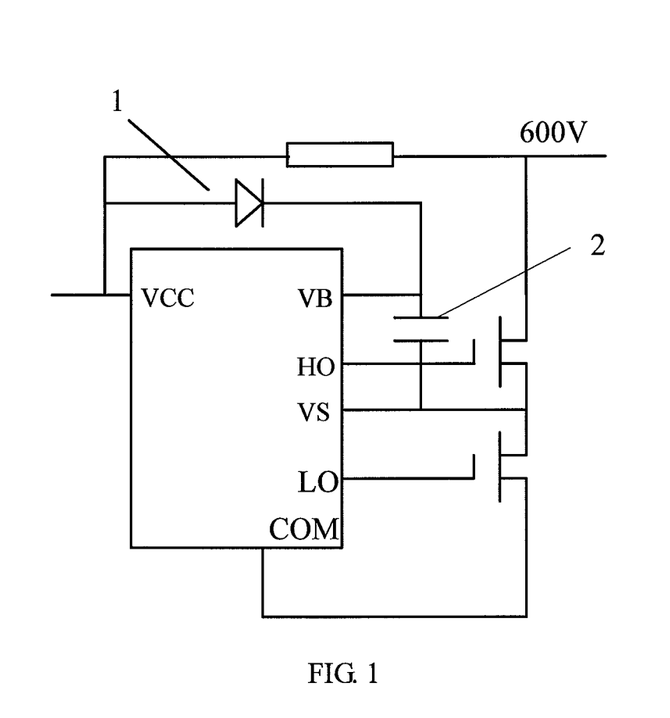
FIG. 1 is a circuit diagram of a half bridge drive circuit of a prior art.

In the high voltage integrated circuit of a prior art, in order to achieve above functions of the bootstrap diode, an external discrete device is often used, the diode chip and the high voltage integrated circuit chip are packaged together, but the essence is the same, i.e. an external diode which can withstand high voltage and recover fast is used to achieve a voltage bootstrapping, and supply power to a circuit on the high voltage side, referring to FIG. 1, the complexity of a design of a peripheral circuit is increased, the difficulty of a circuit debugging is increased, the cost of the circuit is increased.

SUMMARY OF THE INVENTION

A high voltage Schottky diode and a manufacturing method thereof are provided according to an embodiment of the present disclosure, which can withstand high voltage and be used as a bootstrap diode. The manufacturing process of the Schottky diode is compatible with the process of the CMOS, thus the Schottky diode can be integrated into the high voltage integrated circuit.

According to one aspect of the present disclosure, a high voltage Schottky diode is provided.

A high voltage Schottky diode, includes:

a base comprising a P-type substrate, and two N-type buried layers located in a surface of the P-type substrate, wherein a first N-type buried layer is located below a cathode lead-out region of the Schottky diode, a second buried layer is located below a cathode region of the Schottky diode;

an epitaxial layer located on the surface of the P-type substrate;

two N-type well regions located in a surface of the epitaxial layer, wherein a first N-type well region is provided with a cathode lead-out region in a surface thereof, the first N-type well region is a lateral drift region of the Schottky diode, which can withstand high voltage, a second N-type well region is located on a surface of the second N-type buried layer, the second N-type well region is a cathode region of the Schottky diode;

a first P-type well region located on a surface of the second N-type buried layer and surrounding the cathode region configured to protect an edge of the Schottky diode, prevent leakage, and improve withstand-voltage;

a field oxide isolation region located on a surface of the lateral drift region configured to isolate an anode and a cathode of the Schottky diode;

a metal layer located on a surface of the cathode region as the anode of the Schottky diode; and a metal layer located on a surface of the cathode lead-out region configured to lead out the cathode of the Schottky region.

According to one embodiment, the high voltage Schottky diode further includes:

a first P-type well region located on a side of the drift region and a gate region located on a surface of the drift region, the surface of the cathode region being not covered by the gate region;

a dielectric layer located on surfaces of the field oxide isolation region and the gate region, the anode and cathode of the Schottky diode being not covered by the dielectric layer.

According to one embodiment, in a high voltage integrated circuit, the anode of the Schottky diode is connected to a power supply terminal of a low voltage part of the high voltage integrated circuit, and the cathode is connected to a power supply terminal of a high voltage part of the high voltage integrated circuit.

According to one embodiment, in the high voltage integrated circuit, an electric circuit connected to the Schottky diode and configured to lead out a substrate potential of the high voltage integrated circuit comprises:

a P-type buried layer located in the surface of the P-type substrate;

a second P-type well region located in a surface of the epitaxial layer and located on a surface of the P-type buried layer, the second P-type well region and the first P-type well region are formed in the same ion implantation process;

a third N-type well region surrounding the second P-type well region, the third N-type well region abuts the first P-type well region, the third N-type well region and two N-type well regions of the Schottky diode are formed in the same ion implantation process;

a substrate potential lead-out region located in a surface of the second P-type well region, a metal layer located on a surface of the substrate potential lead-out region, configured to lead out the substrate potential; and a field oxide isolation region located on a surface of the third N-type well region, the field oxide isolation region does not cover the substrate potential lead-out region.

According to one embodiment, the substrate potential lead-out region is a P-type heavily doped region, the cathode lead-out region is an N-type heavily doped region.

According to one embodiment, the first N-type buried layer and the second N-type buried layer are N-type lightly doped regions.

According to one embodiment, the lateral drift region, the cathode region and the third N-type well region are N-type lightly doped regions.

According to one embodiment, the metal layer of the anode of the Schottky diode is made of gold, silver, alinium, platinum or molybdenum.

According to another aspect of the present disclosure, a manufacturing of the high voltage Schottky diode is provided.

A method of manufacturing a high voltage Schottky diode includes:

providing a base, the base comprising a P-type substrate and two N-type buried layers located in a surface of the P-type substrate;

forming an epitaxial layer on a surface of the P-type substrate;

forming an injection barrier layer on a surface of the epitaxial layer, forming an etch barrier layer on a surface of the injection barrier layer, forming two N-type well region patterns on the etch barrier layer;

forming two N-type well regions in the surface of the epitaxial layer by using the etch barrier layer with the N-type well region pattern as a mask, the two N-type well region being formed in the same injection process, wherein a first N-type well region is a lateral drift region of the Schottky diode, which can withstand high voltage, a second N-type well region is located on a surface of a second N-type buried layer, the second N-type well region is a cathode region of the Schottky region;

forming a field oxide layer on the surface of the epitaxial layer having the etch barrier layer and two N-type well regions;

removing a material of the etch barrier layer not covered by the field oxide layer, forming a first P-type well region surrounding the cathode region on a surface of the second N-type buried layer by using the field oxide layer as a mask to protect an edge of the Schottky diode and reduce and leakage and improve a withstand-voltage;

forming a cathode lead-out region on a surface of the first N-type well region, the cathode lead-out region being located above a first N-type buried layer;

forming a metal layer on a surface of the cathode region, the metal layer being an anode of the Schottky diode; and forming a metal layer on a surface of the cathode lead-out region to lead out the cathode of the Schottky diode.

According to one embodiment, when the Schottky diode is used in the high voltage integrated circuit to be connected to a substrate potential, a process of manufacturing a circuit connected to the Schottky diode comprising:

forming a P-type buried layer in the surface of the P-type substrate before forming the epitaxial layer and after forming the two N-type barrier layers;

forming a third N-type well region simultaneously with an etching process of forming the two N-type well regions;

forming a second P-type well region simultaneously with an injecting process of forming the first P-type well region, the third N-type well region surrounding the second P-type well region;

forming a substrate potential lead-out region in a surface of the second P-type well region; and forming a metal layer on a surface of the substrate potential lead-out region to lead-out a substrate potential simultaneously with the formation of the cathode metal layer of the Schottky diode.

Compared to a technology of the prior art, the high voltage Schottky diode and its manufacturing method have the following advantages.

In the Schottky diode and it manufacturing method of the present disclosure, the first N-type buried layer is formed below the cathode region of the Schottky diode region, thus a high voltage can be withstood between the cathode and the substrate of the Schottky diode. The second N-type buried layer located below the cathode region can isolate the positive terminal and the substrate of the diode. The first N-type well region located in a surface of the epitaxial layer is a lightly doped long drift region which can withstand high voltage. The cathode region of the Schottky diode is surrounded by the first P-type well region, the cathode and the first P-type well region surrounding the cathode region form a PN junction, which can reduce a leakage of the cathode region and improve the withstand-voltage of the cathode region.

The above structure of the Schottky diode makes the Schottky diode can withstand high voltage, a PN junction is added in the vicinity of the cathode region to prevent leakage, the Schottky diode has a characteristic of fast recovery, thus the Schottky diode can be used as a bootstrap diode. The manufacturing process of the Schottky diode is compatible with the manufacturing process of the CMOS, thus the Schottky diode can be integrated into the high voltage integrated circuit, the debugging difficulty of the electric circuit can be reduced, and the cost of the integrated circuit is reduced.

BRIEF DESCRIPTION OF THE DRAWINGS

The foregoing and other objects, features, and advantages of the invention will be apparent from the following more particular description of the embodiments of the invention, as illustrated in the accompanying drawings. The components in the drawings are not necessarily drawn to scale, the emphasis instead being placed upon clearly illustrating the principles of the present disclosure. Moreover, in the drawings, like reference numerals designate corresponding parts throughout the views.

DETAILED DESCRIPTION OF THE EMBODIMENTS

As described in the background of the disclosure, a conventional bootstrap diode can only be produced in a peripheral circuit, a design complexity and a debugging cost of the peripheral circuit are thus increased. Although the conventional Schottky diode has a characteristic of fast recovery, it cannot withstand high voltage, and it cannot be used as a bootstrap diode.

Based on above considerations, it is considered that, if a Schottky diode which can withstand high voltage is designed, and a manufacturing process of the Schottky diode is compatible with the manufacturing process of a CMOS device, thus the high voltage Schottky diode can be integrated into the high voltage integrated circuit, and an external prior art bootstrap diode can be replaced by the high voltage Schottky diode, a design of the peripheral circuit can be simplified, a cost of manufacturing the high voltage integrated circuit can be reduced.

Reference will now be made in detail to exemplary embodiments of the disclosure, which are illustrated in the accompanying drawings. It should be noted that, the embodiments as described are only a part, but not all, of the embodiments of the present disclosure. All other embodiments made by those of ordinary skill in the art based on the embodiments of the present disclosure, without the expenditure of inventive labor, fall within the protection scope of the present disclosure.

To facilitate the sufficient understanding of the disclosure, many details are set forth in the following description. However, the present disclosure may be implemented in other manners than those described herein, and similar extensions may be made by those skilled in the art without deviating from the spirit of the present disclosure. Therefore the present disclosure is not limited by the embodiments disclosed hereinafter. Furthermore, the present disclosure is described in detail in conjunction with simplified cross sectional views. In describing the embodiments of the present disclosure in detail, for convenient description, sectional views showing structures of the device are not drawn to scale, and these simplified cross sectional views are only examples and should not limit the scope of protection of the present disclosure. Moreover, three-dimensional size including length, width and depth should be given in view of practical implementation.

Figure 2:
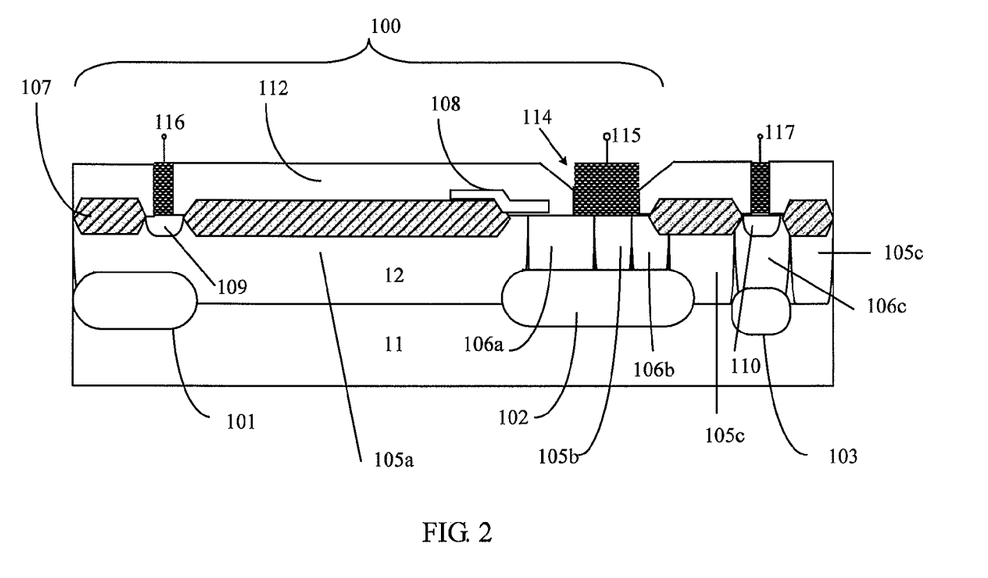
FIG. 2 is a cross sectional view of a high voltage Schottky diode in accordance with one embodiment.

Embodiments of the present disclosure disclose a high voltage Schottky diode, FIG. 2 is a cross sectional view of the Schottky diode 100, the Schottky diode includes: a base, the base includes a P-type substrate 11 and two buried layers 101 and 102 located in a surface of the P-type substrate11, the first N-type buried layer 101 is located below a cathode lead-out region of the Schottky diode, the second N-type buried layer 102 is located below a cathode region of the Schottky diode.

It should be noted that, the base of the illustrated embodiment can be made of semiconductor elements, such as silicon, polycrystalline silicon or amorphous silicon or silicon germanium (SiGe), and can also be made of hybrid semiconductor, such as silicon carbide, indium antimonide, lead telluride, indium arsenide, indium phosphide, gallium arsenide, or gallium antimonide alloy semiconductor, or combinations thereof, and can also be made of silicon on insulator (SOI). The semiconductor base can further be made of other materials, such as multilayer structures of an epitaxial layer or a buried oxide layer. Although several examples of the material that can be used to form the substrate are described herein, any material which can be used as a semiconductor substrate falls within the spirit and the scope of the present disclosure.

An epitaxial layer 12 is located on a surface of the P-type substrate 11.

Two N-type well regions 105a and 105b located in a surface of the epitaxial layer, the first N-type well region 105a is provided with a cathode lead-out region 109 in a surface thereof, the first N-type well region 105a is a lateral drift region of the Schottky diode which can withstand high voltage, the second N-type well region 105b is located on a surface of the second N-type buried layer 102, the second N-type well region 105b is a cathode region of the Schottky diode.

A person skilled in the art can be understood that, in order to withstand high voltage, a thick and lightly doped epitaxial layer and a long drift region are often used. In the illustrated embodiment, in order to improve the withstand-voltage of the Schottky diode, the first N-type well region 105a (i.e. the lateral drift region) and the second N-type well region 105b (cathode region) are both N-type lightly doped regions. In order to reduce an ohmic contact and a contact resistance between the metal layer and the cathode lead-out region 109, the cathode lead-out region 109 is an N-type heavily doped region.

In order to improve a withstand-voltage of the N-type buried layer, the first N-type buried layer and the second N-type buried layer are both N-type lightly doped regions.

A first P-type well region is located on a surface of the second N-type buried layer 105b, the first P-type well region surrounds the cathode region, the first P-type region is configured to protect the edge of the Schottky diode, thus preventing leakage and improving the withstand-voltage.

The FIG. 2 is a cross sectional view, the first P-type well region are divided into two parts surrounding the second N-type buried layer 105b, which are shown as 106a and 106b. A PN junction is formed on a contact edge of the first P-type well region and the second N-type buried layer 105b. As the PN junction has a barrier voltage, conductive particles of the Schottky diode are electrons, under normal condition, the PN junction formed by the first P-type well region and the second N-type buried layer can prevent electrons in the second N-type well region from diffusing to the edge of the second N-type well region, thus a leakage is prevented, a leakage of the cathode region can be reduced, the Schottky has a characteristic of small leakage.

A field oxide isolation region 107 is located on a surface of the lateral drift region, the field oxide isolation region isolates the anode and the cathode of the Schottky diode.

A person skilled in the art can be understood that, the main function of the field oxide isolation region is to isolate device to avoid unwanted short circuit or conductivity in a normal operating state of an electric circuit. In the integrated circuit, when a device is needed to be electric isolated, a field oxide isolation region is often disposed above an active region. The other parts of the Schottky diode in the illustrated embodiment may also have a field oxide isolation region, the distribution of the field oxide isolation region may be the same as that of a normal Schottky diode, or change according to the structure of the Schottky diode, in this regard, the present embodiment is not limited.

A metal layer is located on a surface of the cathode region (i.e. the second N-type well region 105b), it is an anode 115 of the Schottky diode. A metal layer located on a surface of the cathode lead-out region, it is configured to lead out a cathode 116 of the Schottky diode.

A metal of the anode and a metal on a surface of the cathode lead-out region can be formed in the same metal deposition or sputtering process. The metal of the anode can be gold, silver, aluminum, platinum or molybdenum, the materials can be selected according to an actual situation The Schottky diode further includes:

A first P-type well region 106a, which is located close to a side of the drift region and a gate region 108 located on a surface of the drift region, a surface of the cathode region is not covered by the gate region 108;

A dielectric layer 112, which is located on a surface of the field oxide isolation region 107 and the gate region 108, the anode 115 and the cathode 116 of the Schottky diode are not covered by the dielectric layer 112.

The gate region 108 can be made of gate polysilicon or metal. In the illustrated embodiment, in order to facilitate the integration of the Schottky diode and a CMOS, the gate region 108 is preferably made of gate polysilicon. A gate dielectric layer needs to be formed before the formation of the gate region, the gate dielectric layer (not shown) is located below the gate region 108 of the Schottky diode, the gate dielectric layer can be made of one or more materials selected from a group consisting of $SrTiO_3$, $HfO_2$, $ZrO_2$, and $SiO_2$. In the illustrated embodiment, the gate dielectric layer is a gate oxide layer (referred hereinafter to as gate oxide).

The dielectric layer 112 can be one or more selected from a group consisting of pre-metal dielectric layer PMD, inter-metal dielectric layer IMD, and the interlayer dielectric layer ILD, in this regard, the present embodiment is not limited, as long as the dielectric layer 112 is provided with a through hole communicating with the active region, the through hole is configured to expose the anode and the cathode of the Schottky diode. The dielectric layer 112 is provided with a contact hole communicating with the cathode lead-out region 109, it communicates with the cathode region and defines an anode window 114 of the anode of the Schottky diode.

Figure 9:
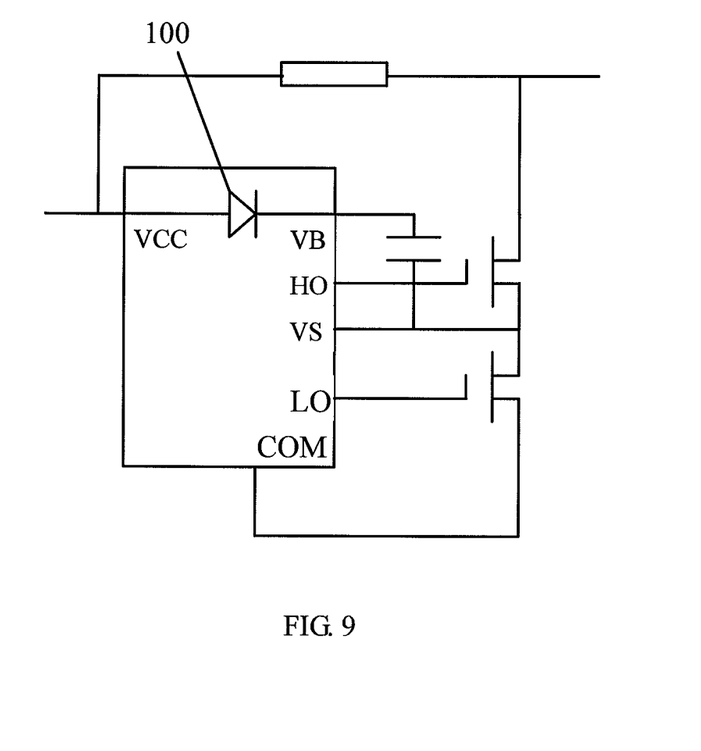
FIG. 9 is a circuit diagram of the half bridge drive circuit integrated with the high voltage Schottky diode in accordance with one embodiment.

It should be noted that, when the Schottky diode is integrated into a high voltage integrated circuit, the anode of the Schottky diode is connected to a power supply terminal of a low voltage part of the integrated circuit, and the cathode is connected to a power supply terminal of a high voltage part of the integrated circuit. Referring to FIG. 9, the power supply terminal of the low voltage part of the integrated circuit is the VCC terminal shown in FIG. 9, the power supply terminal of the high basin part of the integrated circuit is the VB terminal shown in FIG. 9. Specifically, the cathode of the Schottky diode is connected to the power supply terminal of the high basin part in such a way that the cathode region (i.e. the second N-type well region 105b) is connected to the first N-type well region 105a through the second N-type buried layer 102, and then is connected to the cathode 116 through the cathode lead-out region 109, in the metal connection stage, the cathode 116 is connected to the power supply terminal of the high basin part of the high voltage integrated circuit. The high basin part refers to a high voltage part of the integrated circuit, and the voltage of this part is a floating voltage.

Referring to FIG. 2, when the Schottky diode is integrated in the high voltage integrated circuit, an electric circuit is needed to lead out the ground potential which refers to substrate potential. Specifically the electric circuit configured to lead out the substrate potential includes:

A P-type buried layer 103 located in a surface of the P-type substrate 11, the P-type buried layer 103 is located below a substrate potential lead-out region, thus the ground potential of the chip is connected to the P-type substrate 11, the ground potential is the lowest potential in the chip, the substrate potential is the ground potential, the P-type buried layer 103 and the two N type buried layer are successively manufactured.

A second P-type well region 106c is located in a surface of the epitaxial layer 12 and above a surface of the P-type buried layer 103, the second P-type well region 106c and the first P-type well regions 106a and 106b are formed in the same injection process.

The third N-type well region 105c surrounds the second P-type well region 106c, the third N-type well region 105c is close to the first P-type well regions 106a and 106b, the third N-type well region 105c and the two N-type well region s 105a and 105b of the Schottky diode are formed in the same injection process, thus the third N-type well region 105c is a N-type lightly doped region. In the cross sectional view, the third N-type well region 105c is divided into two parts which are located on two sides of the second P-type well region 106c.

A substrate potential lead-out region 110 located in a surface of the second P-type well region 106c, a metal layer 117 located on a surface of the substrate potential lead-out region, configured to lead out the substrate potential. The metal layer 117, the cathode 116 and the anode 115 are formed in the same metal layer deposition or sputtering process, in order to reduce the contact resistance, the substrate potential lead-out region is a P-type heavily doped region.

A field oxide isolation region 107 is located on a surface of the third N-type well region 105c, configured to isolate the device and the conductive regions of the device, the substrate lead-out region 110 is not covered by the field oxide isolation region 107.

Similar to the Schottky diode, the electric circuit connected to the Schottky diode is provided with a dielectric layer 112, the dielectric layer 112 defines a contact hole communicating with the substrate potential lead-out region 110. The contact hole communicated with the substrate potential lead-out region 110 and the contact hole communicated with the cathode lead-out region are formed in the same lithography process.

In summary, in the manufacturing process of the integrated circuit, the same type of regions can be formed in the same lithography process, e.g. the same type of doped buried layer, the same type of doped well region of the first N-type buried layer 101 and the second N-type buried layer 102, and the first N-type well region 105a and the second N-type well region 105b are formed in the same lithography process. The field oxide layers, the dielectric layers, and the through holes etc. of different regions can also be formed in the same process.

The first N-type buried layer is formed below the cathode lead out region of the Schottky diode, thus a high voltage can be withstood between the cathode and the substrate of the Schottky diode. The second N-type buried layer located below the cathode region can isolate the positive terminal and the substrate of the diode. The first N-type well region located in a surface of the epitaxial layer is a lightly doped long drift region which can withstand high voltage. The cathode of the Schottky is surrounded by the first P-type well region, the cathode and the first P-type well region surrounding the cathode region form a PN junction, which can reduce a leakage of the cathode region and improve the withstand-voltage of the cathode region.

The above structure of the Schottky diode makes the Schottky diode can withstand high voltage, a PN junction is added in the vicinity of the cathode region to prevent leakage, the Schottky diode has a characteristic of fast recovery, thus the Schottky diode can be used as a bootstrap diode. The manufacturing process of the Schottky diode is compatible with the manufacturing process of the CMOS, thus the Schottky diode can be integrated into the high voltage integrated circuit, the debugging difficulty of the electric circuit can be reduced, and the cost of the integrated circuit is reduced.

Figure 3:
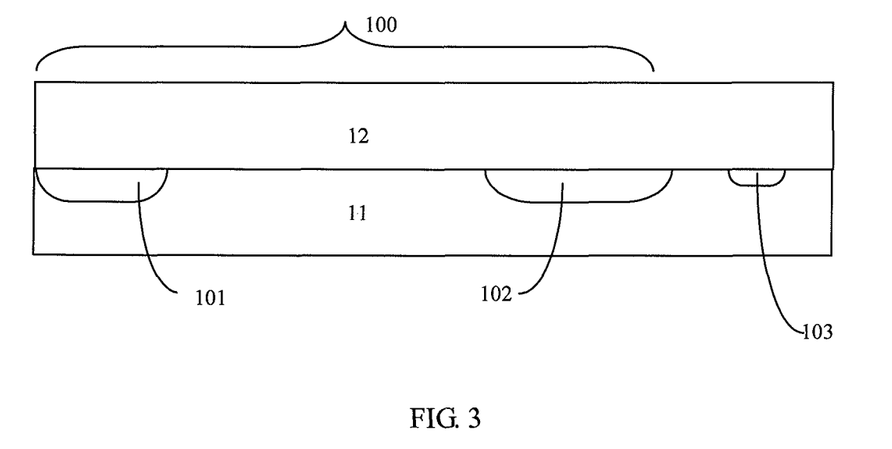
FIGS. 3 through 8 are cross sectional views showing a method of manufacturing the Schottky diode in accordance with one embodiment.

In accordance with the above structure, another embodiment of the present disclosure discloses a method of manufacturing the Schottky diode, cross sectional views of the method are shown as FIG. 3 to FIG. 8, the method below combines the manufacturing process of the Schottky diode and the manufacturing process of the peripheral electric circuit of the Schottky diode for a comprehensive description, the method includes the following steps:

In step 1, referring to FIG. 3, a base is provided, the base includes a P-type substrate 11 and two N-type buried layers 101 and 102 located in a surface of the P-type substrate 11.

Specifically, the P-type substrate 11 is firstly spin coated with a photoresist layer. In order to ensure an accuracy of the exposure, an anti reflective coating (not shown) is formed between the photoresist layer and the P-type substrate 11 to reduce unwanted reflection. Then the photoresist layer is exposed by using a mask plate with two N-type buried layer patterns to form a two N-type buried layer patterns on a surface of the photoresist layer. Phosphorus ion or other element ion is implanted to form two N-type buried layers by using the photoresist layer with two N-type buried layer pattern as a mask. An annealing process such as a rapid thermal annealing process is performed to activate impurity ions implanted in the two N-type buried layer, a desired junction depth (i.e. a promotion process) is formed in the P-type substrate 11, the two N-type buried layers 101 and 102 are formed.

The first N-type buried layer 101 is located below the cathode of the Schottky diode, thus a high voltage can be withstood between the cathode and the P-type substrate of the Schottky diode. The second N-type buried layer 102 is located below the anode, the second N-type buried layer 102 isolates the anode and the substrate.

In step 2, referring to FIG. 3, after the two N-type buried layers are formed, a P-type buried layer 103 is formed by performing a lithography process and an ion implantation process, thus the P-type substrate 11 is connected to the ground potential. An annealing process is performed after the ion implantation process to promote the junction depth. The difference between forming an N-type buried layer and forming a P-type buried layer is that a boron ion or other trivalent element ion is implanted to form a P-type buried layer.

In step 3, referring to FIG. 3, an epitaxial layer 12 is formed on a surface of the P-type substrate 11, specifically, the N-type epitaxial layer 12 is grown at one time on the surface of the P type substrate by performing a CVD process or a thermal oxidization process, the thickness of the epitaxial layer is determined according to the application requirement of the device.

Figure 4:
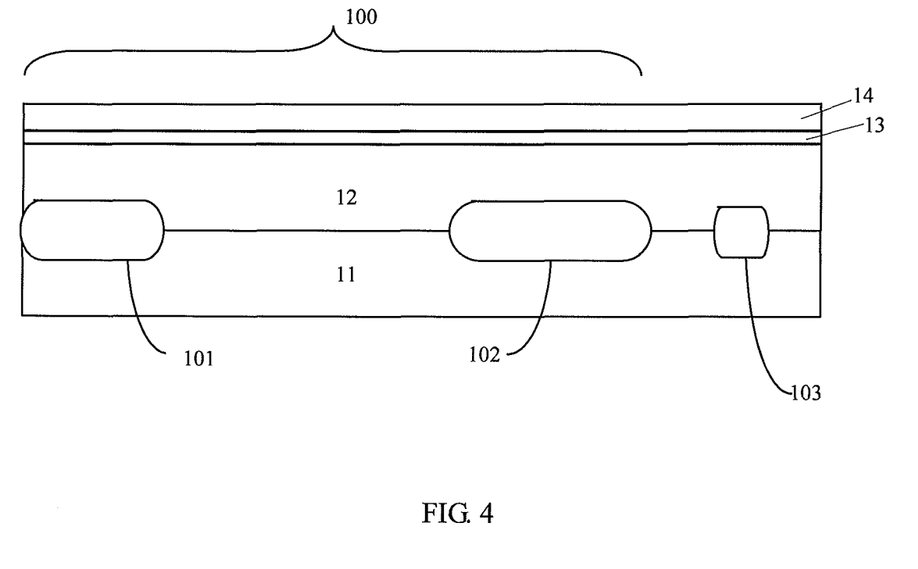

In step 4, referring to FIG. 4, an injection barrier layer 13 is formed on a surface of the epitaxial layer 12, an etch barrier layer 14 is formed on a surface of the injection barrier layer 13, two N-type well region patterns are formed on the etch barrier layer 14, the two N-type well region patterns include a first N-type well region pattern 15 and a second N-type well region pattern 16, a third N-type well region pattern 17 is formed simultaneously in the same lithography process.

The injection barrier layer 13 is a thin oxide layer, the etch barrier layer 14 is a silicon nitride layer. Specifically, a thin oxide layer is firstly grown on the surface of the epitaxial layer 12, then a silicon nitride layer is formed on the surface of the thin oxide layer by performing a chemical vapor deposition process.

After the etch barrier layer is formed, a photoresist is spin coated on a surface of the etch barrier layer to form a photoresist layer, a photoresist layer is exposed by using a mask plate with three N-type well region patterns, three N-type well region patterns are formed on a surface of the photoresist layer. Then the etch barrier layer not covered by the photoresist layer is removed through performing a dry etching or a wet etching process by using a photoresist layer with three N-type well region patterns as a mask, three N-type well region patterns are formed on the etch barrier layer.

Figure 5:
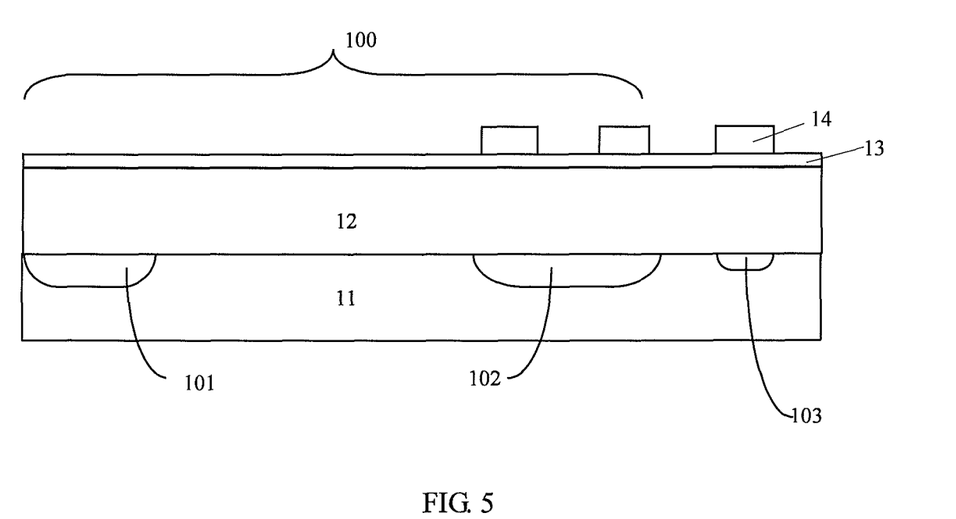

In step 5, referring to FIG. 5, three N-type well regions are formed in a surface of the epitaxial layer by using the etch barrier layer with the N-type well region patterns as a mask, the three N-type well regions are formed in the same injection process. The first N-type well region 105a is a lateral drift region of the Schottky diode, which can withstand high voltage. The second N-type well region 105b is located on a surface of the second N-type buried layer 102, the second N-type well region 105b is the cathode region of the Schottky diode.

When only the Schottky diode is manufactured, only the first and the second N-type well region need to be formed. Impurity ions of P or other pentavalent elements are implanted, an annealing process is performed after the ion implantation to activate the implanted ions, thus a desired junction depth is obtained.

Figure 6:
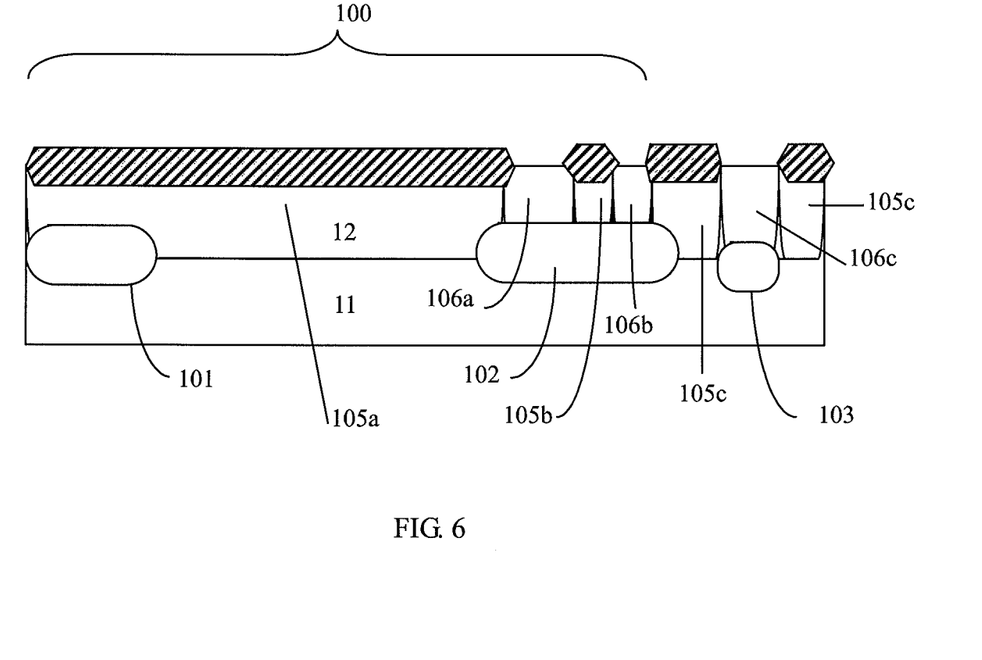

Step 6, referring to FIG. 6, a field oxide layer is formed on a surface of the epitaxial layer with the etch barrier layer and the N-type well region. The field oxide layer cannot be grown on regions with the etch barrier layer 14 (a silicon nitride layer), field oxides are only formed on surfaces of the three N-type well regions, the field oxides refer to thick oxide layers.

In step 7, referring to FIG. 6, the etch barrier layer not covered by the field oxide layer is removed. First P-type well regions 106a and 106b surrounding the cathode region are formed on a surface of the second N-type buried layer by performing a self aligned ion implantation process to protect the edge of the Schottky diode, and reduce leakage, and improve withstand-voltage. In the same ion implantation process, a second P-type well region 106c is formed on a surface of the P-type buried layer 103 simultaneously. The second P-type well region 106c is surrounded by the third N-type well region 105c to prevent leakage.

For the same reason, an annealing process is performed after the ion implantation process to activate the implanted ion, the impurity ions implanted into the P-type well region are B ions or other trivalent element ions.

Figure 7:
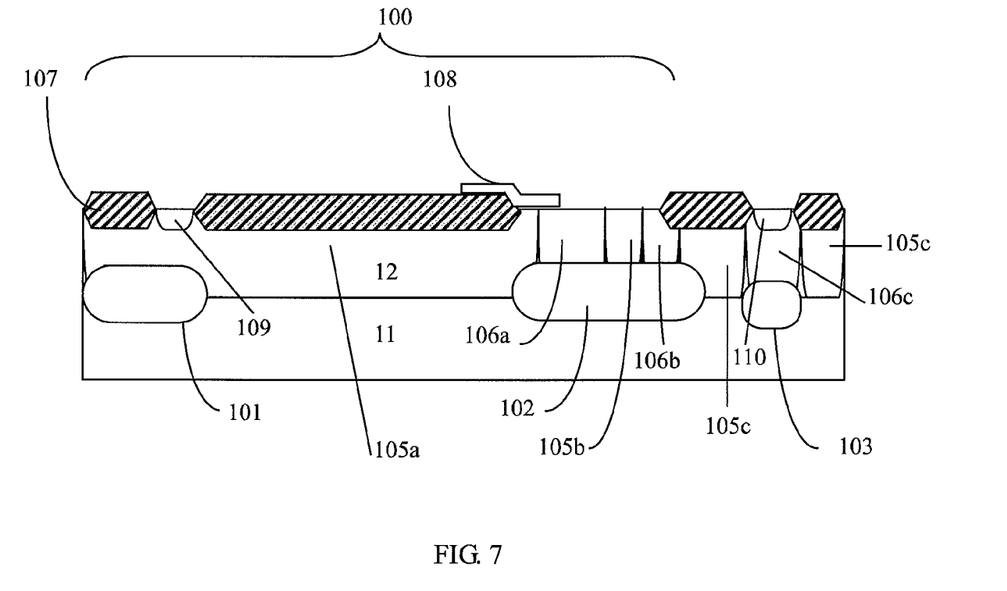

In step 8, referring to FIG. 7, a cathode lead-out region is formed in a surface of the first N-type well region 105a, the cathode lead-out region is located above the first N-type buried layer, a substrate potential lead-out region is formed in a surface of the second P-type well region.

Specifically, the field oxide is photo etched by performing a local oxidation isolation (LOCOS) process which is common in CMOS processes to form an active region. Referring to FIG. 7, field oxide materials located above the cathode lead-out region and the second N-type well region 105b are removed, thus the cathode lead-out region and the second N-type well region 105b are exposed, then a gate dielectric layer is grown, the gate dielectric layer is a gate oxide layer (not shown). A gate layer is formed on a surface of the gate dielectric layer by performing a chemical vapor deposition process, the gate layer is a gate polysilicon layer. Excess materials of the gate layer are then removed by performing a lithography process and an etching process to obtain a gate region 108.

Then the cathode lead-out region 109 configured to lead out the cathode of the Schottky diode is formed by performing a lithography process and an ion implantation process, the cathode lead-out region is a N-type heavily doped region. B ions or other trivalent element ions are implanted into a surface of the second P-type well region 106c by performing a lithography process and an ion implantation process to form a substrate potential lead-out region 110 configured to lead out substrate potential, the substrate potential lead-out region 110 is a P-type heavily doped region. A sequence between forming the cathode region 109 and forming the substrate potential lead-out region 110 can be changed, which is not specifically limited in the illustrated embodiment.

Figure 8:
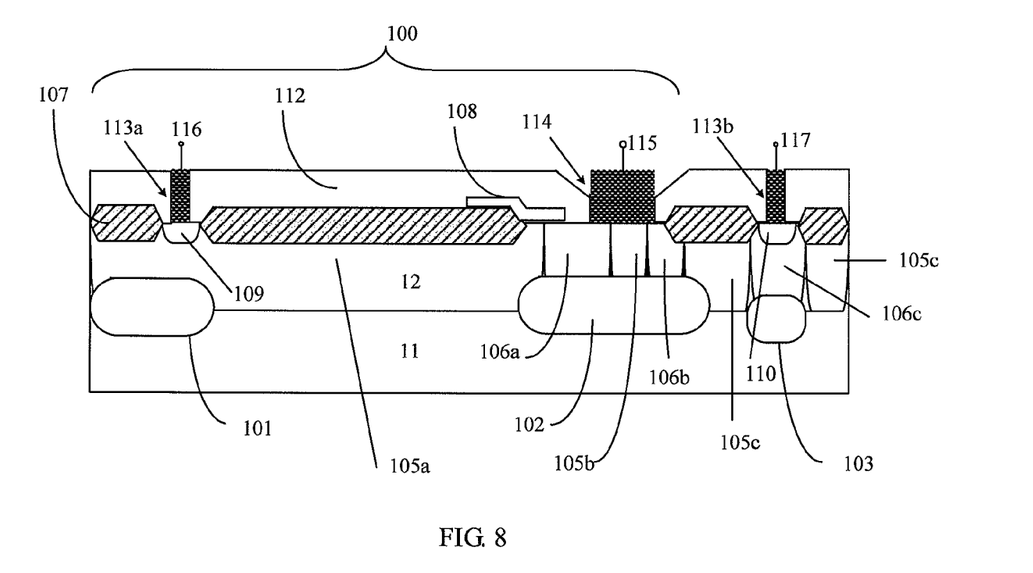

In step 8, referring to FIG. 8, a metal layer is formed on a surface of the cathode region, the metal layer is configured to be an anode of the Schottky diode. A metal layer is formed on a surface of the cathode lead-out region to lead out the cathode of the Schottky diode. A metal layer is formed on a surface of the substrate potential lead-out region to lead out the substrate potential.

Specifically, when integrated with a CMOS process, after a source and a drain injection processes and an annealing process, a dielectric layer 112 is formed by performing a chemical vapor deposition process, the dielectric layer is planarized by performing a chemical mechanical polishing process, a contact hole 113a is defined in a surface of the dielectric layer located above the cathode lead-out region by performing a lithography process and an etching process, the contact hole 113a is configured to lead out the cathode of the Schottky diode. A contact hole 113b is defined in a surface of the dielectric layer 112 located above the substrate potential lead-out region, the contact hole 113b is configured to lead out the substrate potential. Then an anode window 114 of the Schottky diode is defined in a surface of the dielectric layer located above the cathode region by performing a lithography process and an etching process.

Then a metal layer is formed by performing a sputtering process, a vapor deposition process or a HDP process, the metal layer is polished and etched to remove the excess metal layer material. An anode 115 of the Schottky diode is formed on a surface of the cathode region, a cathode 116 of the Schottky diode is formed on a surface of the cathode lead-out region, a metal layer 117 is formed on a surface of the substrate potential lead-out region to lead out the substrate potential.

The term "in a surface of the epitaxial layer" refers to a region extending downwardly a certain depth from the surface of the epitaxial layer. The term "on a surface of the epitaxial layer" refers to a region extending upwardly from the surface of the epitaxial layer, which is not belonged to the epitaxial layer, others may be deduced by analogy.

The method of manufacturing the Schottky diode of the present disclosure is compatible with the conventional CMOS process, the Schottky diode can be integrated into the high voltage integrated circuit, and a circuit diagram of the Schottky diode connected to an electric circuit is shown in FIG. 9. Taking a half bridge drive circuit of the prior art as an example, the Schottky diode is a bootstrap diode, it is integrated into the integrated circuit, thus a design of a peripheral circuit is simplified, the difficulty of a circuit debugging is reduced, the cost of manufacturing the integrated circuit system is reduced.

Although the present invention has been described with reference to the embodiments thereof and the best modes for carrying out the present invention, it is apparent to those skilled in the art that a variety of modifications and changes may be made without departing from the scope of the present invention, which is intended to be defined by the appended claims.

What is claimed is:

1. A high voltage Schottky diode, comprising:
a base comprising a P-type substrate, and two N-type buried layers located in a surface of the P-type substrate, wherein a first N-type buried layer is located below a cathode lead-out region of the Schottky diode, a second buried layer is located below a cathode region of the Schottky diode;
an epitaxial layer located on the surface of the P-type substrate;
two N-type well regions located in a surface of the epitaxial layer, wherein a first N-type well region is provided with the cathode lead-out region in a surface thereof, the first N-type well region is a lateral drift region of the Schottky diode, which can withstand high voltage, a second N-type well region is located on a surface of the second N-type buried layer, the second N-type well region is the cathode region of the Schottky diode;
a first P-type well region located on a surface of the second N-type buried layer and surrounding the cathode region configured to protect an edge of the Schottky diode, prevent leakage, and improve withstand-voltage;
a field oxide isolation region located on a surface of the lateral drift region configured to isolate an anode and a cathode of the Schottky diode;
a metal layer located on a surface of the cathode region as the anode of the Schottky diode; and
a metal layer located on a surface of the cathode lead-out region configured to lead out the cathode of the Schottky region.

2. The Schottky diode according to claim 1, further comprising:
the first P-type well region located on a side of the drift region and a gate region located on a surface of the drift region, the surface of the cathode region being not covered by the gate region;
a dielectric layer located on surfaces of the field oxide isolation region and the gate region, the anode and cathode of the Schottky diode being not covered by the dielectric layer.

3. The Schottky diode according to claim 2, wherein in a high voltage integrated circuit, the anode of the Schottky diode is connected to a power supply terminal of a low voltage part of the high voltage integrated circuit, and the cathode is connected to a power supply terminal of a high voltage part of the high voltage integrated circuit.

4. The Schottky diode according to claim 3, wherein the first N-type buried layer and the second N-type buried layer are N-type lightly doped regions.

5. The Schottky diode according to claim 3, wherein in the high voltage integrated circuit, an electric circuit connected to the Schottky diode and configured to lead out a substrate potential of the high voltage integrated circuit comprises:
a P-type buried layer located in the surface of the P-type substrate;
a second P-type well region located in a surface of the epitaxial layer and located on a surface of the P-type buried layer, the second P-type well region and the first P-type well region are formed in the same ion implantation process;
a third N-type well region surrounding the second P-type well region, the third N-type well region abuts the first P-type well region, the third N-type well region and two N-type well regions of the Schottky diode are formed in the same ion implantation process;
a substrate potential lead-out region located in a surface of the second P-type well region, a metal layer located on a surface of the substrate potential lead-out region, configured to lead out the substrate potential; and
a field oxide isolation region located on a surface of the third N-type well region, the field oxide isolation region does not cover the substrate potential lead-out region.

6. The Schottky diode according to claim 5, wherein the first N-type buried layer and the second N-type buried layer are N-type lightly doped regions.

7. The Schottky diode according to claim 5, wherein the substrate potential lead-out region is a P-type heavily doped region, the cathode lead-out region is an N-type heavily doped region.

8. The Schottky diode according to claim 7, wherein the first N-type buried layer and the second N-type buried layer are N-type lightly doped regions.

9. The Schottky diode according to claim 2, wherein the first N-type buried layer and the second N-type buried layer are N-type lightly doped regions.

10. The Schottky diode according to claim 1, wherein the first N-type buried layer and the second N-type buried layer are N-type lightly doped regions.

11. The Schottky diode according to claim 10, wherein the lateral drift region, the cathode region and the third N-type well region are N-type lightly doped regions.

12. The Schottky diode according to claim 11, wherein the metal layer of the anode of the Schottky diode is made of gold, silver, alinium, platinum or molybdenum.

13. A method of manufacturing a high voltage Schottky diode, comprising:
- providing a base, the base comprising a P-type substrate and a first N-type buried layer and a second N-type buried layer located in a surface of the P-type substrate;
- forming an epitaxial layer on a surface of the P-type substrate;
- forming an injection barrier layer on a surface of the epitaxial layer, forming an etch barrier layer on a surface of the injection barrier layer, forming two N-type well region patterns on the etch barrier layer;
- forming two N-type well regions in the surface of the epitaxial layer by using the etch barrier layer with the N-type well region patterns as a mask, the two N-type well regions being formed in the same injection process, wherein a first N-type well region is a lateral drift region of the Schottky diode, which can withstand high voltage, a second N-type well region is located on a surface of the second N-type buried layer, the second N-type well region is a cathode region of the Schottky region;
- forming a field oxide layer on the surface of the epitaxial layer having the etch barrier layer and two N-type well regions;
- removing the etch barrier layer not covered by the field oxide layer, forming a first P-type well region surrounding the cathode region on a surface of the second N-type buried layer by using the field oxide layer as a mask, said P-type well region protects an edge of the Schottky diode and reduces leakage and improves a withstand-voltage;
- forming a cathode lead-out region on a surface of the first N-type well region, the cathode lead-out region being located above the first N-type buried layer;
- forming a metal layer on a surface of the cathode region, the metal layer being an anode of the Schottky diode; and
- forming a metal layer on a surface of the cathode lead-out region to lead out the cathode of the Schottky diode.

14. The method according to claim 13, wherein the Schottky diode is used in the high voltage integrated circuit to be connected to a substrate potential, and a process of manufacturing a circuit connected to the Schottky diode comprises:
- forming a P-type buried layer in the surface of the P-type substrate before forming the epitaxial layer and after forming the first and second N-type buried layers;
- forming a third N-type well region simultaneously with the injection process of forming the two N-type well regions;
- forming a second P-type well region simultaneously with an injecting process of forming the first P-type well region, the third N-type well region surrounding the second P-type well region;
- forming a substrate potential lead-out region in a surface of the second P-type well region; and
- forming a metal layer on a surface of the substrate potential lead-out region to lead-out a substrate potential simultaneously with the formation of a cathode metal layer of the Schottky diode.

* * * * *